United States Patent
Chen et al.

(10) Patent No.: US 11,450,605 B2
(45) Date of Patent: Sep. 20, 2022

(54) REDUCING INTERNAL NODE LOADING IN COMBINATION CIRCUITS

(71) Applicant: Taiwan Semiconductor Manufacturing Company, Ltd., Hsinchu (TW)

(72) Inventors: Chien-Yuan Chen, Hsinchu (TW); Cheng-Hung Lee, Hsinchu (TW); Hung-Jen Liao, Hsin-Chu (TW); Hau-Tai Shieh, Hsinchu (TW); Kao-Cheng Lin, Taipei (TW); Wei-Min Chan, Sindian (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 37 days.

(21) Appl. No.: 17/173,750

(22) Filed: Feb. 11, 2021

(65) Prior Publication Data

US 2022/0254712 A1 Aug. 11, 2022

(51) Int. Cl.
| | |
|---|---|
| *H01L 23/528* | (2006.01) |
| *H01L 27/11* | (2006.01) |
| *H01L 27/092* | (2006.01) |
| *G06F 30/392* | (2020.01) |
| *H01L 21/8238* | (2006.01) |

(52) U.S. Cl.
CPC .......... *H01L 23/528* (2013.01); *G06F 30/392* (2020.01); *H01L 21/823807* (2013.01); *H01L 21/823814* (2013.01); *H01L 21/823871* (2013.01); *H01L 21/823878* (2013.01); *H01L 27/092* (2013.01); *H01L 27/1104* (2013.01)

(58) Field of Classification Search
CPC .......... H01L 23/528; H01L 21/823807; H01L 21/823814; H01L 21/823871; H01L 21/823878; H01L 27/092; H01L 27/1104; G06F 30/392
See application file for complete search history.

(56) References Cited

U.S. PATENT DOCUMENTS

| | | | | |
|---|---|---|---|---|
| 6,271,542 | B1 * | 8/2001 | Emma ................. | H01L 27/1108 257/67 |
| 2014/0040838 | A1 * | 2/2014 | Liu ......................... | G03F 1/36 716/53 |
| 2014/0153322 | A1 | 6/2014 | Liaw | |
| 2018/0061487 | A1 | 3/2018 | Liaw | |
| 2018/0330765 | A1 * | 11/2018 | Chen ..................... | G11C 7/065 |

FOREIGN PATENT DOCUMENTS

TW 428310 B 4/2001

* cited by examiner

*Primary Examiner* — Karen Kusumakar
*Assistant Examiner* — Adam S Bowen
(74) *Attorney, Agent, or Firm* — Merchant & Gould, P.C.

(57) ABSTRACT

Circuit devices, such as integrated circuit devices, are constructed with combination circuits that include two or more cascading transistors, and one or more metal layers disposed over the cascading transistors. The cascading transistors include multiple internal nodes (e.g., common source/drain regions). The multiple internal nodes are not connected to a common metal stripe (the same metal stripe) in the one or more metal layers. The absence of the connections between the internal nodes and a common metal stripe reduce or eliminate the load on the internal nodes. The transistors in the cascading transistors are independent of each other.

20 Claims, 16 Drawing Sheets

REDUCING INTERNAL NODE LOADING IN COMBINATION CIRCUITS

BACKGROUND

Over the last several decades the semiconductor fabrication industry has been driven by a continual demand for greater performance (e.g., increased processing speed, memory capacity, etc.), a shrinking form factor, extended battery life, and lower cost. In response to this demand, the industry has continually reduced a size of semiconductor device components, such that modern day integrated circuit (IC) devices may comprise millions or billions of semiconductor devices arranged on a single semiconductor die.

BRIEF DESCRIPTION OF THE DRAWINGS

Aspects of the present disclosure are best understood by the following detailed description in conjunction with the accompanying drawings, where like reference numerals designate like structural elements. It is noted that various features in the drawings are not drawn to scale. In fact, the dimensions of the various features may be arbitrarily increased or reduced for clarity of discussion.

DETAILED DESCRIPTION

Figure 1:
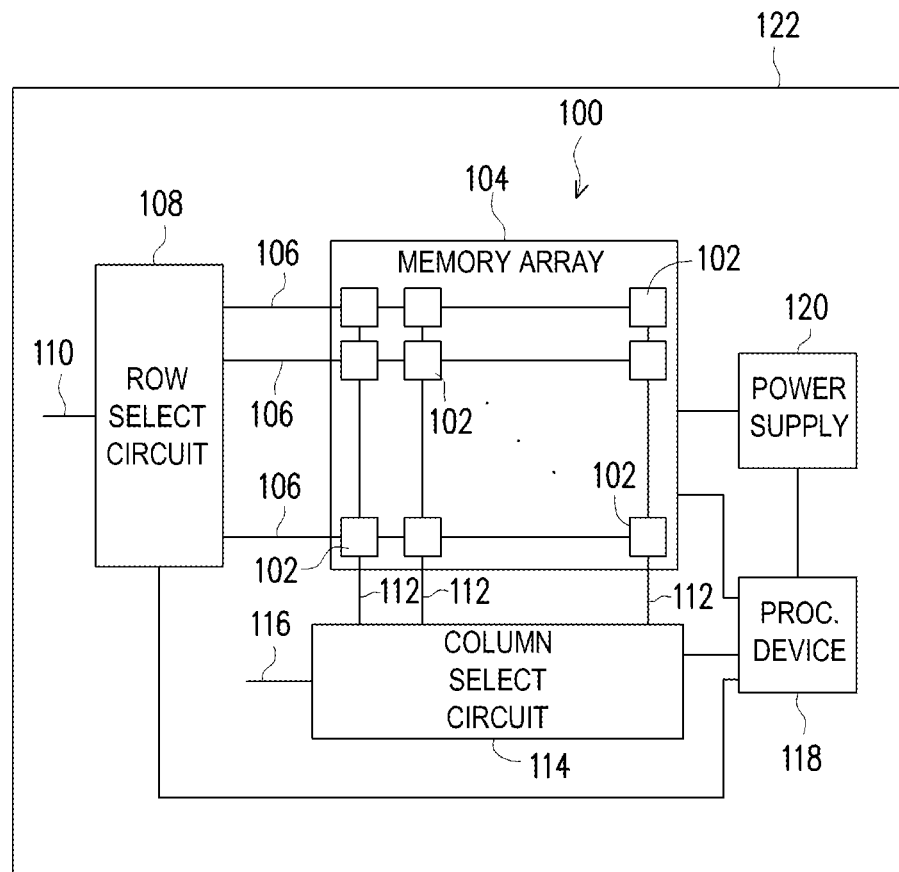
FIG. 1 depicts a block diagram of an example integrated circuit device in which aspects of the disclosure may be practiced in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "under", "upper," "top," "bottom," "front," "back," and the like, may be used herein for ease of description to describe one element or feature's relationship to another element(s) or feature(s) as illustrated in the Figure(s). The spatially relative terms are intended to encompass different orientations of the device in use or operation in addition to the orientation depicted in the figures. Because components in various embodiments can be positioned in a number of different orientations, the directional terminology is used for purposes of illustration only and is in no way limiting. When used in conjunction with layers of an integrated circuit, semiconductor device, or electronic device, the directional terminology is intended to be construed broadly, and therefore should not be interpreted to preclude the presence of one or more intervening layers or other intervening features or elements. Thus, a given layer that is described herein as being formed on, over, or under, or disposed on, over, or under another layer may be separated from the latter layer by one or more additional layers.

Integrated circuits are commonly used in various electronic devices. Integrated circuits typically include combination circuits that provide or contribute to the functionality or functionalities of the integrated circuit. A combination circuit is a circuit that includes one or more set of cascading transistors, where the number of transistors in each set of cascading transistors is greater than one. Example combination circuits include, but are not limited to, logic components such as a flip flop, latch, NAND, OR, AND, and NOR circuits. Many of the combination circuits include two or more cascading transistors, such as, for example, cascading metal-oxide semiconductor (MOS) transistors.

In some integrated circuits, all of the cascading transistors in a combination circuit are connected to the same metal stripe in a metal layer, such as a metal stripe in an M0 layer. Since the cascading transistors are formed in the same active diffusion region (e.g., an OD region), have the same gates, and are connected to the same metal stripe, the cascading transistors are identical to each other but are not independent of each other. Additionally, the connections to the same metal stripe in the metal layer increase the load on each internal node in the cascading transistors. For example, two cascading transistors are formed when the transistors are connected in series. The internal node is the connection between a terminal (e.g., S/D region) of the first transistor and a terminal (e.g., S/D region) of the second transistor, which is the connection at the common source/drain region. When the cascading transistors are connected to the same metal stripe (e.g., using a via-to-diffusion (VD) connection), the load on the internal node is increased, which in turn can adversely impact the performance of the combination circuit. For example, the power consumption and/or the delay timing of the combination circuit can increase.

Embodiments disclosed herein provide layouts for combination circuits that reduce or eliminate the load on each internal node in a set of cascading transistors. As described herein, the load on each internal node can be reduced or eliminated by constructing the cascading transistors in an active diffusion region without connecting the internal nodes to the same metal stripe in the same metal layer (e.g., the M0 layer). In such a construction, the cascading transistors are both identical and independent of each other.

The embodiments described herein are described with respect to metal layers, metal stripes, poly layers, and poly lines. However, other embodiments are not limited to metal layers, metal stripes, poly layers, and poly lines. Any suitable conductor that is made of one or more conductive materials can be used. Additionally, the conductors can be formed in one or more conductor layers.

These and other embodiments are discussed below with reference to FIGS. 1-10. However, those skilled in the art will readily appreciate that the detailed description given herein with respect to these Figures is for explanatory purposes only and should not be construed as limiting.

FIG. 1 depicts a block diagram of an example integrated circuit in which aspects of the disclosure may be practiced in accordance with some embodiments. The illustrated integrated circuit is a memory device 100, although other embodiments are not limited to this type of an integrated circuit. Any integrated circuit or combination circuit that includes cascading transistors can employ the invention.

The memory device 100 includes memory cells 102 that are arranged in rows and columns to form a memory array 104. The memory device 100 can include any suitable number of rows and columns. For example, a memory device includes R number of rows and C number of columns, where R is an integer greater than or equal to one and C is a number greater than or equal to one. Other embodiments are not limited to rows and columns of memory cells 102. The memory cells 102 in a memory array 104 can be organized in any suitable arrangement.

Each row of memory cells 102 is operably connected to one or more word lines (collectively word line 106). The word lines 106 are operably connected to one or more row select circuits (collectively referred to as row select circuit 108). The row select circuit 108 selects a particular word line 106 based on an address signal that is received on signal line 110.

Each column of memory cells 102 is operably connected to one or more bit lines (collectively bit line 112). The bit lines 112 are operably connected to one or more column select circuits (collectively referred to as column select circuit 114). The column select circuit 114 selects a particular bit line 112 based on a select signal that is received on signal line 116.

A processing device 118 is operably connected to the memory array 104, the row select circuit 108, and the column select circuit 114. The processing device 118 is operable to control one or more operations of the memory array 104, the row select circuit 108, and the column select circuit 114. Any suitable processing device can be used.

Example processing devices include, but are not limited to, a central processing unit, a microprocessor, an application specific integrated circuit, a graphics processing unit, a field programmable gate array, or combinations thereof.

A power supply 120 is operably connected to the memory array 104 and the processing device 118. In some embodiments, the power supply 120 is also operably connected to the row select circuit 108 and the column select circuit 114. The processing device 118 and/or the power supply 120 can be disposed in the same circuitry (e.g., macro) as the memory array. In an example embodiment, the macro refers to a memory unit that includes the memory array and peripherals such as the control block, input/output block, row decoder circuitry, column decoder circuitry, etc. In other embodiments, the processing device 118 and/or the power supply 120 may be disposed in separate circuitry and operably connected to the macro (e.g., the memory array).

When data is to be written to a memory cell 102 (e.g., the memory cell 102 is programmed), or is to be read from a memory cell 102, an address for the memory cell is received on signal line 110. The row select circuit 108 activates or asserts the word line 106 associated with the address. A select signal is received on the signal line 116 and the bit line 112 associated with the select signal is asserted or activated. The data is then written to, or read from, the memory cell 102.

The memory device 100, the row select circuit 108, the column select circuit 114, the processing device 118, and the power supply 120 are included in an electronic device 122. The electronic device 122 can be any suitable electronic device. Example electronic devices include, but are not limited to, a computing device such as a laptop computer and a tablet, a cellular telephone, a television, an automobile, a stereo system, and a camera.

The memory device 100 typically includes one or more combination circuits that are constructed with one or more sets of cascading transistors. For example, one or more of the memory array 104, the row select circuit 108, the column select circuit 114, the processing device 118, and/or the power supply 120 includes at least one or more sets of cascading transistors. Each set of cascading transistors can include two or more transistors. In some embodiments, the transistors in a set of cascading transistors has a size defined by (2fin×m), where m is the number of the cascading transistors in the set, m is greater than one, and the number of internal nodes is greater than one. Some or all of the combination circuits may employ the present invention.

Figure 2:
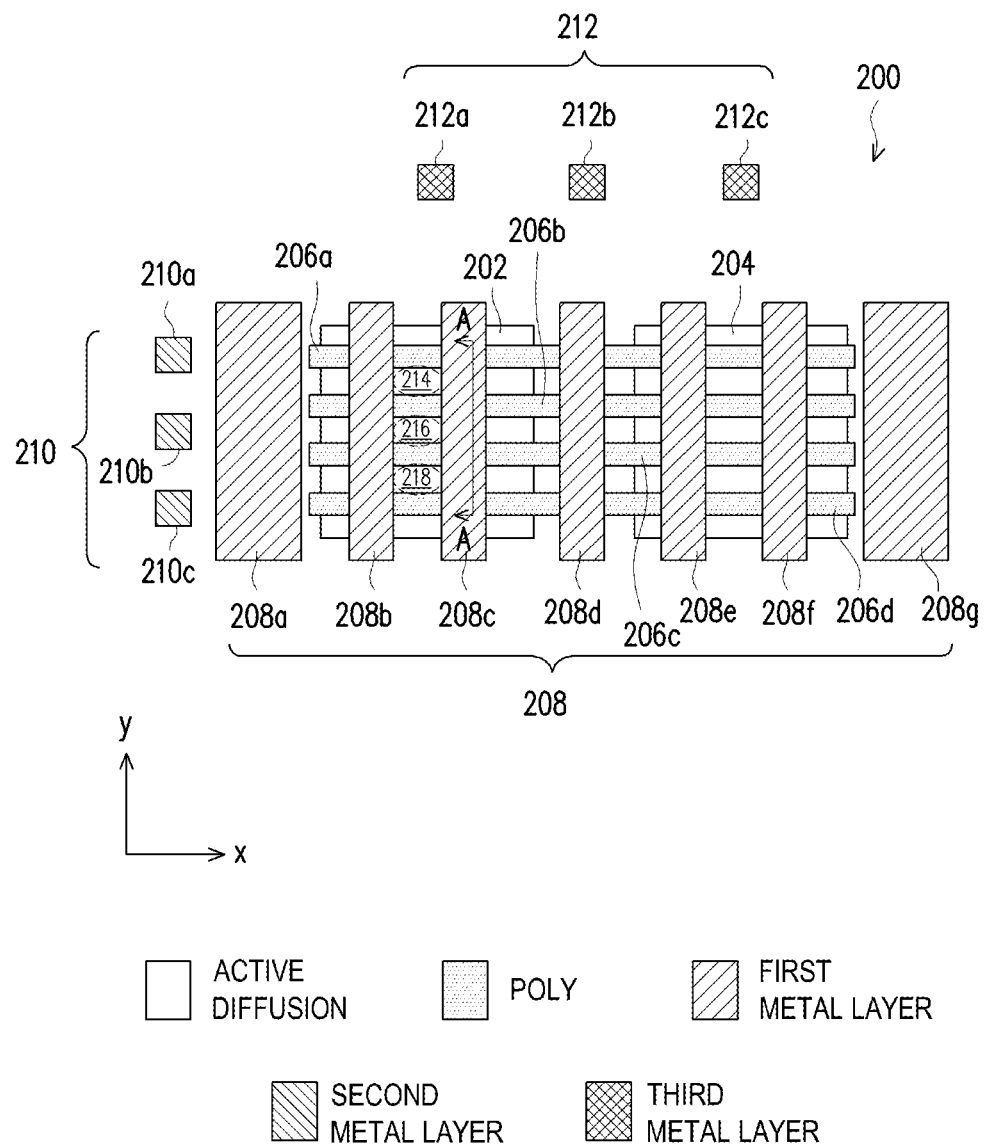
FIG. 2 illustrates a layout of a portion of an integrated circuit in accordance with some embodiments.

FIG. 2 illustrates a layout of a portion of an integrated circuit in accordance with some embodiments. The layout 200 includes a first active diffusion region 202 and a second active diffusion region 204 that are disposed in the y direction. Polysilicon ("poly") lines 206a, 206b, 206c, 206d are disposed in the x direction over the first and the second active diffusion regions 202, 204. The first and the second active diffusion regions 202, 204 can include fin structures that are disposed on a substrate (not shown) and serve as active regions of the transistors (e.g., source/drain regions). The poly lines 206a, 206b, 206c, 206d act as gates for the transistors.

A first metal layer 208 (e.g., the M0 layer) is disposed over the first active diffusion region 202, the second active diffusion region 204, and the poly lines 206a, 206b, 206c, 206d. In the illustrated embodiment, the first metal layer 208 includes metal stripes 208a, 208b, 208c, 208d, 208e, 208f, 208g. In a non-limiting example, the metal stripes 208a, 208g provide one or more voltage sources (e.g., VDD and VSS) and the metal stripes 208b, 208c, 208d, 208e, 208f are used for various signals.

The first metal layer 208 is a metal layer at the bottom of a plurality of metal layers (e.g., an M0 layer). In the illustrated embodiment, the first metal layer 208 is positioned below a second metal layer 210 (e.g., an M1 layer), and the second metal layer 210 is disposed below a third metal layer 212 (e.g., an M2 layer). The first metal layer 208, the second metal layer 210, and the third metal layer 212 form a stack of metal layers. Other embodiments are not limited to three metal layers in the stack of metal layers. Any number of metal layers can be included in a stack of metal layers.

As shown in FIG. 2, the first metal layer 208 is positioned between an overlying second metal layer 210 and the underlying first active diffusion region 202, the second active diffusion region 204, and the poly lines 206a, 206b, 206c, 206d. The second metal layer 210 includes example metal stripes 210a, 210b, 210c. The second metal layer 210 is disposed between an overlying third metal layer 212 and the underlying second metal layer 210. The third metal layer 212 includes example metal stripes 212a, 212b, 212c. Other embodiments can include any number of metal stripes in the first metal layer 208, the second metal layer 210, and the third metal layer 212.

The first and the second active diffusion regions 202, 204 (e.g., oxide diffusion (OD) regions) include fin structures that are disposed on a substrate (not shown) and serve as active regions of the transistors in the integrated circuit. Specifically, the fin structures serve as channel regions of the transistors when positioned below the polysilicon ("poly") lines 206a, 206b, 206c, 206d and/or serve as source/drain (S/D) regions when positioned below the metal stripes. In a non-limiting example, the first active diffusion region 202 is an S/D region for p-type transistors and the second active diffusion region 204 is an S/D region for n-type transistors. In the illustrated embodiment, one or more of the nodes represent an internal node 214, 216, 218 in a set of cascading transistors, where the set of cascading transistors includes two or more cascading transistors. As is described in more detail later, the load on the internal nodes 214, 216, 218 is reduced or eliminated because the internal nodes 214, 216, 218 are not connected to the same metal stripe (a "common metal stripe") in any of the first, the second, or the third metal layers 208, 210, 212 in the metal stack.

Figure 3:
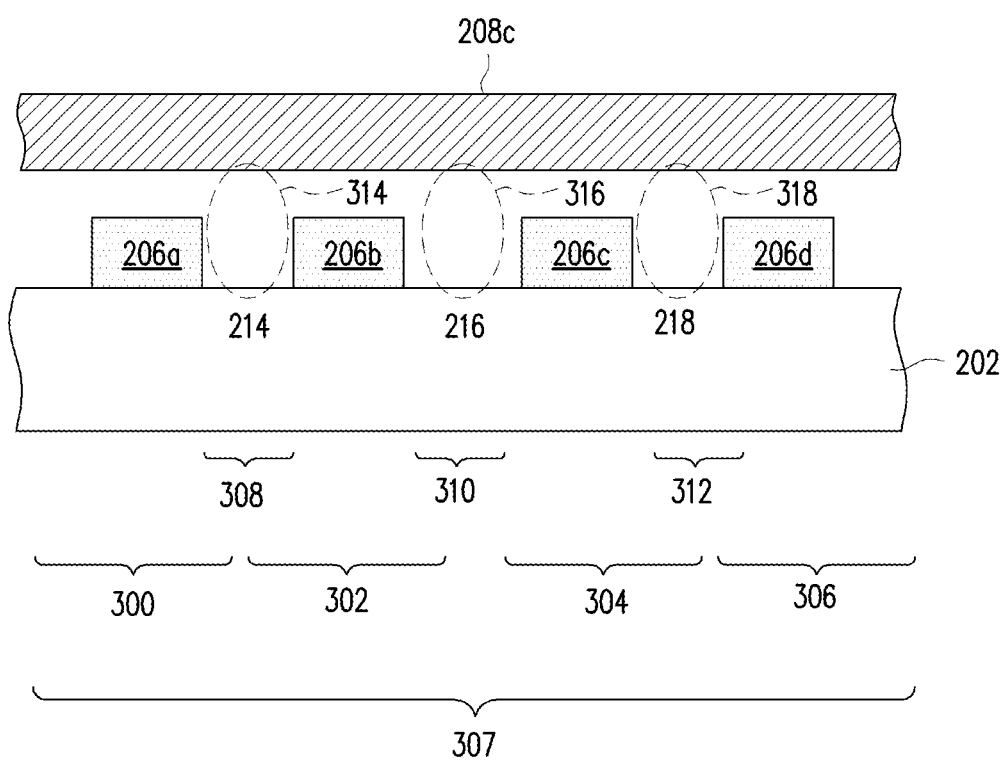
FIG. 3 depicts a cross-sectional view taken along line A-A of the portion of the integrated circuit shown in FIG. 2 in accordance with some embodiments.

FIG. 3 depicts a cross-sectional view of a portion of the integrated circuit shown in FIG. 2 in accordance with some embodiments. The poly lines 206a, 206b, 206c, 206d are disposed over the first active diffusion region 202. The metal stripe 208c in the first metal layer is positioned over the poly lines 206a, 206b, 206c, 206d and the first active diffusion region 202. In the illustrated embodiment, transistors 300, 302, 304, 306 form a set 307 of cascading transistors that include the internal nodes 214, 216, 218. A terminal (e.g., S/D region) of the transistor 300 is connected to a terminal (e.g., S/D region) of the transistor 302 at the internal node 214 (e.g., the common S/D region 308). A terminal (e.g., S/D region) of the transistor 302 is connected to a terminal (e.g., S/D region) of the transistor 304 at the internal node 216 (the common S/D region 310). A terminal (e.g., S/D region) of the transistor 304 is connected to a terminal (e.g., S/D region) of the transistor 306 at the internal node 218 (the common S/D region 312). Transistors 300, 302, 304, 306 are identical in that the transistors 300, 302, 304, 306 are formed in the same active diffusion region (e.g., same S/D regions) and have the same gates.

As shown in FIG. 3, a connection between the metal stripe 208c and the internal node 214 is absent (see highlighted area 314), a connection between the metal stripe 208c and the internal node 216 is absent (see highlighted area 316), and a connection between the metal stripe 208c and the internal node 218 is absent (see highlighted area 318). The load on the internal nodes 214, 216, 218 is reduced or eliminated due to the lack of connections to a common metal stripe (e.g., metal stripe 208c in the first metal layer). Additionally, the transistors 300, 302, 304, 306 are independent of each other since the internal nodes 214, 216, 218 are not connected to the same metal stripe (the connections between the metal stripe 208c and the internal nodes 214, 216, 218 do not exist). Further, the internal nodes 214, 216, 218 are not connected to a common metal stripe in any of the metal layers overlying the first metal layer (e.g., metal layers 210, 212 in FIG. 2).

Figure 4:
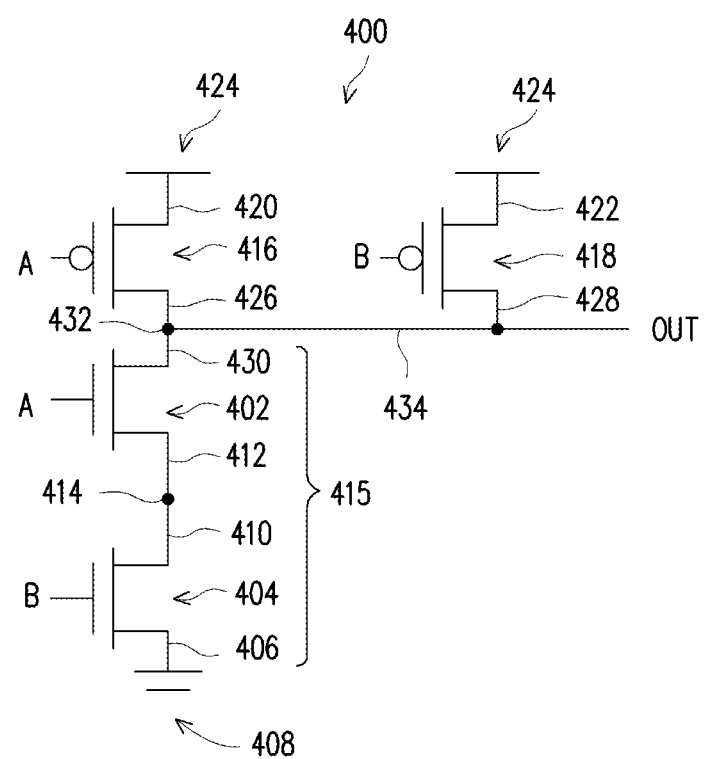
FIG. 4 illustrates a schematic diagram of a NAND circuit in accordance with some embodiments.

As noted earlier, an integrated circuit typically includes a variety of combination circuits that include cascading transistors. FIG. 4 illustrates an example first combination circuit in accordance with some embodiments. The example first combination circuit 400 is a NAND circuit. The first combination circuit 400 includes a transistor 402 connected in series with a transistor 404. In the illustrated embodiment, the transistors 402, 404 are n-type transistors, and one example of an n-type transistor is an NMOS transistor. A terminal (e.g., S/D region) 406 of the transistor 404 is connected to a voltage source 408 (e.g., VSS or ground). A terminal (e.g., S/D region) 410 of the transistor 404 is connected to a terminal (e.g., S/D region) 412 of the transistor 402 at an internal node 414. The first and the second transistors 402, 404 are cascading transistors and form a set 415 of cascading transistors.

A transistor 416 is connected in parallel with a transistor 418. In the illustrated embodiment, the transistors 416, 418 are p-type transistors, and one example of a p-type transistor is a PMOS transistor. The transistor 416 is also connected in series with the transistor 402. A terminal (e.g., S/D region) 420 of the transistor 416 and a terminal (e.g., S/D region) 422 of the transistor 418 are connected to a voltage source 424 (e.g., VSS or ground). A terminal (e.g., S/D region) 426 of the transistor 416, a terminal (e.g., S/D region) 428 of the transistor 418, and a terminal (e.g., S/D region) 430 of the transistor 402 are connected together at node 432. An output signal line 434 is connected to node 432.

The transistors 402, 404, 416, 418 can be constructed with any suitable number of fins. Some or all of the transistors 402, 404, 416, 418 are n×m transistors, where the variable n represents the number of fins and the variable m represents the number of transistors. For example, in one embodiment, the transistors 402, 404 are implemented as 2×2 transistors (2 fins, two transistors). Thus, each transistor 402, 404 in FIG. 4 represents two transistors (for a total of four transistors). In another embodiment, the transistors 402, 404 are implemented as 2×4 transistors (2 fins, four transistors), and each transistor 402, 404 is four transistors (for a total of eight transistors).

Figure 5:
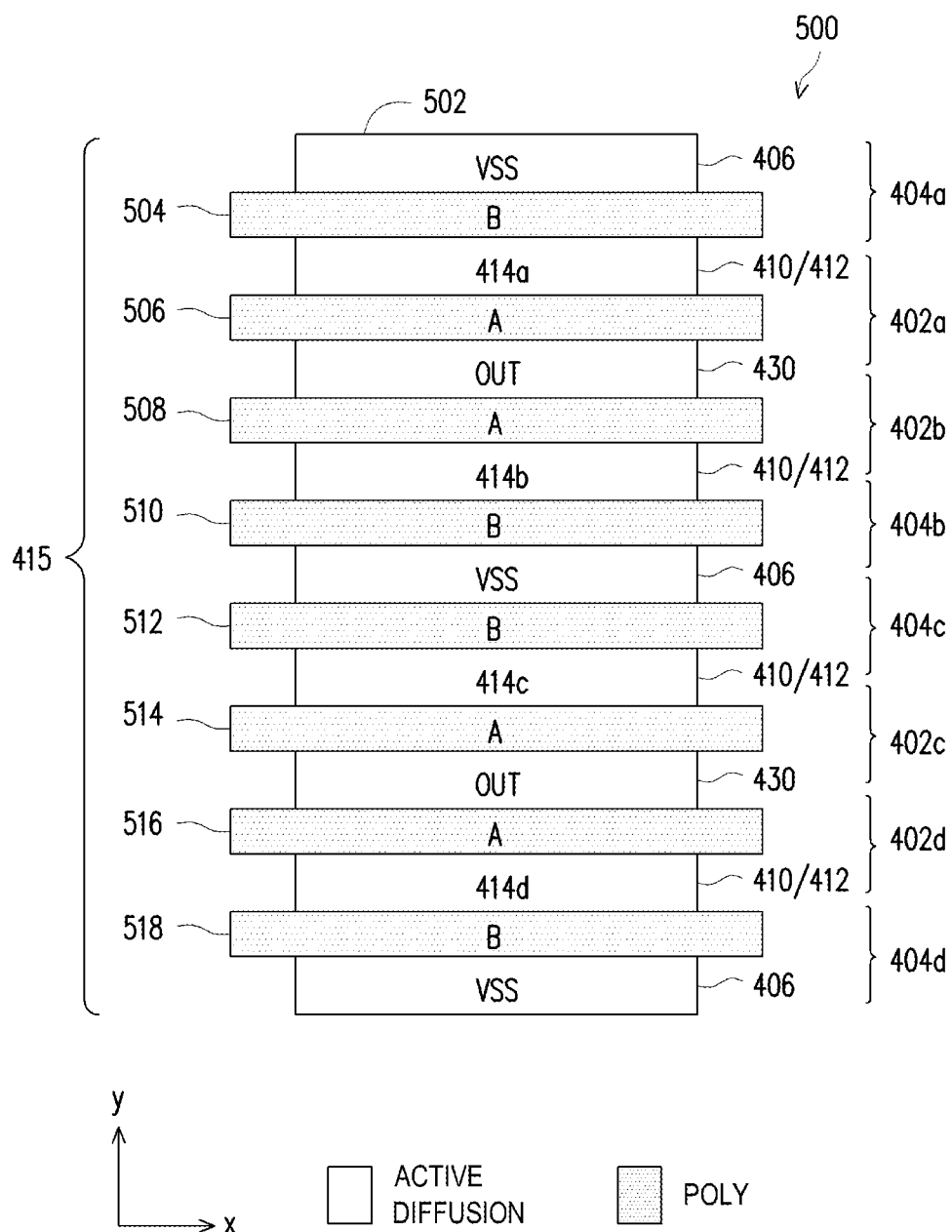
FIG. 5 depicts an example layout of the NAND circuit shown in FIG. 4 in accordance with some embodiments.

FIG. 5 depicts an example layout of the first combination circuit shown in FIG. 4 in accordance with some embodiments. The example layout 500 represents an embodiment where the transistors 402, 404 are implemented as 2×4 transistors (2 fins, four transistors). The layout 500 includes an active diffusion region 502 (e.g., active diffusion region 202 in FIG. 2) disposed in the y direction. As described earlier, the active diffusion region 502 includes one or more fin structures that are disposed on a substrate (not shown) and serve as the active regions of the transistors 402, 404(FIG. 4). The illustrated active diffusion region 502 includes the n-type well region and the fins for the n-type transistors 402, 404.

Poly lines 504, 506, 508, 510, 512, 514, 516, 518 are disposed over the active diffusion region 502 in the x direction. Poly lines 504, 510, 512, 518 function as the gate B for the four transistors 404a, 404b, 404c, 404d, respectively, (see FIG. 4) in the set 415. The S/D region 406 is represented above the poly line 504, below the poly line 518, and between the poly lines 510, 512.

The common S/D region 410, 412 is positioned below the poly line 504 and above the poly line 506, below the poly line 508 and above the poly line 510, below the poly line 512 and above the poly line 514, and below the poly line 516 and above the poly line 518. The common S/D regions 410, 412 are the internal nodes 414a, 414b, 414c, 414d.

The poly lines 506, 508, 514, 516 act as the gate A for the four transistors 402a, 402b, 402c, 402d in the set 415. S/D region ("OUT") 430 of the four transistors 402a, 402b, 402c, 402d is shown below the poly line 506 and above the poly line 508 and below the poly line 514 and above the poly line 516.

Although not shown in FIG. 5, a stack of metal layers (e.g., first metal layer 208, second metal layer 210, and third metal layer 212 shown in FIG. 2) is disposed over the active region 502 and the poly lines 504, 506, 508, 510, 512, 514, 516. The layout 500 does not include a connection between the internal nodes 414a, 414b, 414c, 414d and a common (e.g., the same) metal stripe in any of the metal layers in the stack of metal layers. For example, there are no connections between the internal nodes 414a, 414b, 414c, 414d and a common metal stripe in the first metal layer. The functions of the transistors 402a, 402b, 402c, 402d, 404a, 404b, 404c, 404d are the same as conventional transistors, but the connections between the internal nodes 414a, 414b, 414c, 414d and a common metal stripe in a metal layer (e.g., M0 layer) in the stack of metal layers is absent. Each internal node 414a, 414b, 414c, 414d is independent of the other internal nodes 414a, 414b, 414c, 414d, and the loading on the internal nodes 414a, 414b, 414c, 414d is reduced or eliminated due to the nonexistent connection between a common metal stripe and the internal node 414. Additionally, the transistors 402a, 402b, 402c, 402d 404a, 404b, 404c, 404d are both identical and independent of each other.

Figure 6:
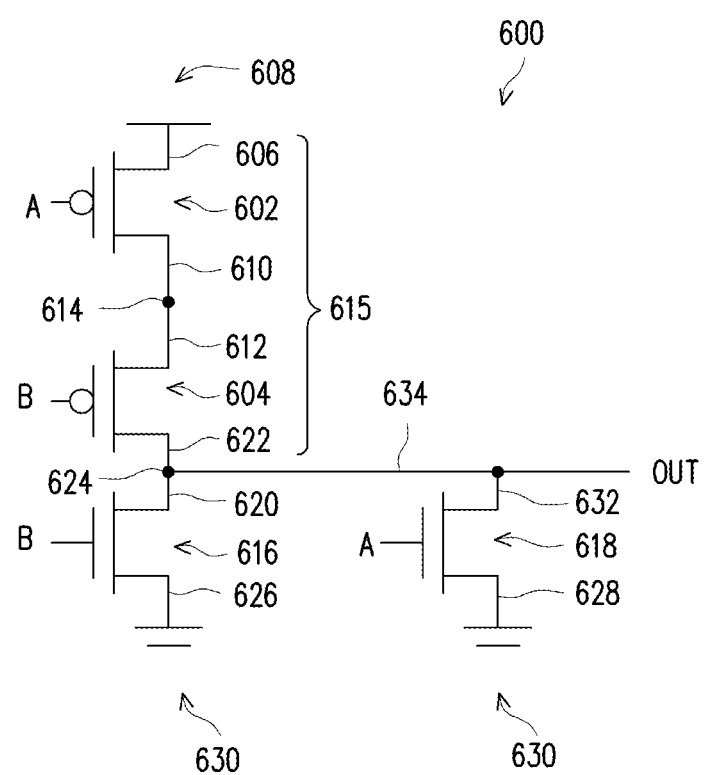
FIG. 6 illustrates a schematic diagram of a NOR circuit in accordance with some embodiments in accordance with some embodiments.

FIG. 6 illustrates an example second combination circuit in accordance with some embodiments. The example second combination circuit 600 is a NOR circuit. The second combination circuit 600 includes a transistor 602 connected in series with a transistor 604. In the illustrated embodiment, the transistors 602, 604 are p-type transistors, and one example of a p-type transistor is a PMOS transistor. A terminal (e.g., S/D region) 606 of the transistor 602 is connected to a voltage source 608 (e.g., VSS). A terminal (e.g., S/D region) 610 of the transistor 602 is connected to a terminal (e.g., S/D region) 612 of the transistor 604 at an internal node 614. The first and the second transistors 602, 604 are cascading transistors and form a set 615 of cascading transistors.

A transistor 616 is connected in parallel with a transistor 618. The depicted transistors 616, 618 are n-type transistors, and one example of an n-type transistor is an NMOS transistor. The transistor 616 is also connected in series with the transistor 604. A terminal (e.g., S/D region) 620 of the transistor 616 and a terminal (e.g., S/D region) 622 of the transistor 604 are connected together at node 624. An output line is connected to the node 624. The terminal (e.g., S/D region) 626 of the transistor 616 and a terminal (e.g., S/D region) 628 of the transistor 618 are connected to a voltage source 630 (e.g., VSS or ground).

The transistors 602, 604, 616, 618 can be constructed with any suitable number of fins. Some or all of the transistors 602, 604, 616, 618 are n×m transistors. For example, in one embodiment, the transistors 602, 604 are implemented as 2×2 transistors (2 fins, two transistors). Thus, each transistor 602, 604 in FIG. 6 represents two transistors (for a total of four transistors). In another embodiment, the transistors 602, 604 are implemented as 2×4 transistors (2 fins, four transistors), and each transistor 602, 604 is four transistors (for a total of eight transistors).

Figure 7:
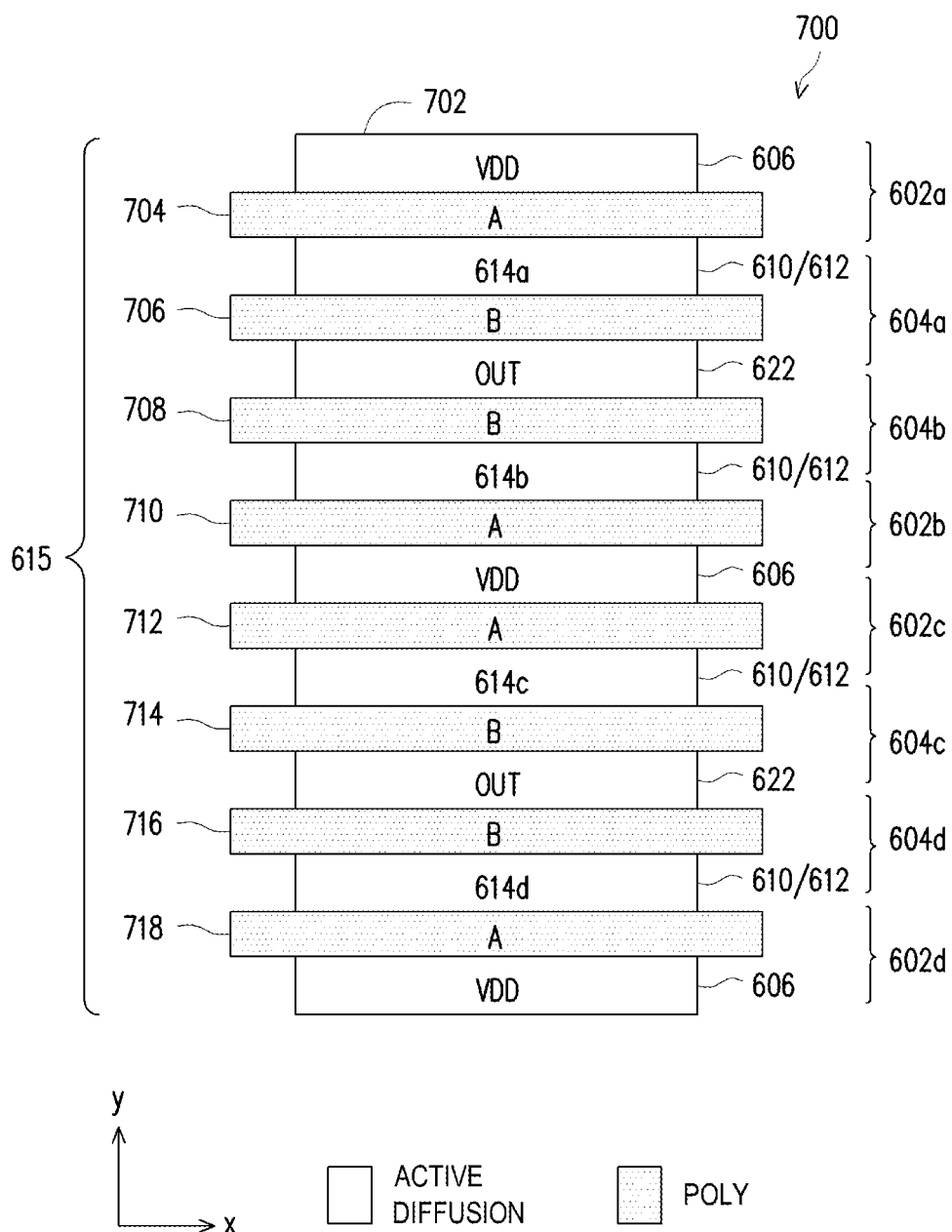
FIG. 7 depicts an example layout of the NOR circuit shown in FIG. 6 in accordance with some embodiments.

FIG. 7 depicts an example layout of the second combination circuit shown in FIG. 6 in accordance with some embodiments. The example layout 700 represents an embodiment where the transistors 602, 604 are implemented as 2×4 transistors (2 fins, four transistors). The layout 700 includes an active diffusion region 702 (e.g., active diffusion region 204 in FIG. 2) disposed in the y direction. As described earlier, the active diffusion region 702 includes one or more fin structures that are disposed on a substrate (not shown). The illustrated active diffusion region 702 includes the p-type well region for the p-type transistors 602, 604.

Poly lines 704, 706, 708, 710, 712, 714, 716 are disposed over the active diffusion region 702 in the x direction. Poly lines 704, 710, 712, 718 function as the gate A for the four transistors 602a, 602b, 602c, 602d, respectively, (see FIG. 6) in the set 615. The S/D region 606 is represented above the poly line 704, below the poly line 718, and between the poly lines 710, 712.

The common S/D region 610, 612 is positioned below the poly line 704 and above the poly line 706, below the poly line 708 and above the poly line 710, below the poly line 712 and above the poly line 714, and below the poly line 716 and above the poly line 718. The common S/D regions 610, 612 are the internal nodes 614a, 614b, 614c, 614d.

The poly lines 706, 708, 714, 716 act as the gate B for the four transistors 604a, 604b, 604c, 604d in the set 615. S/D region ("OUT") 622 of the four transistors 604a, 604b, 604c, 604d is shown below the poly line 706 and above the poly line 708 and below the poly line 714 and above the poly line 716.

Although not shown in FIG. 7, a first metal layer (e.g., M0 layer) is disposed over the active region 702 and the poly lines 704, 706, 708, 710, 712, 714, 716. The embodiment does not have any connections between the internal nodes 614a, 614b, 614c, 614d and a common metal stripe in the M0 layer. The functions of the transistors 602a, 602b, 602c, 602d, 604a, 604b, 604c, 604d are the same as conventional transistors but connections between the internal nodes 614a, 614b, 614c, 614d and a common metal stripe in the M0 layer are absent. Each internal node 614a, 614b, 614c, 614d is independent of the other internal nodes 614a, 614b, 614c, 614d, and the loading on the internal nodes 614a, 614b, 614c, 614d is reduced or eliminated due to the nonexistent connections between a metal stripe in the M0 layer to the internal nodes 614a, 614b, 614c, 614d. Additionally, the transistors 602a, 602b, 602c, 602d, 604a, 604b, 604c, 604d are both identical and are independent of each other.

Figure 8:
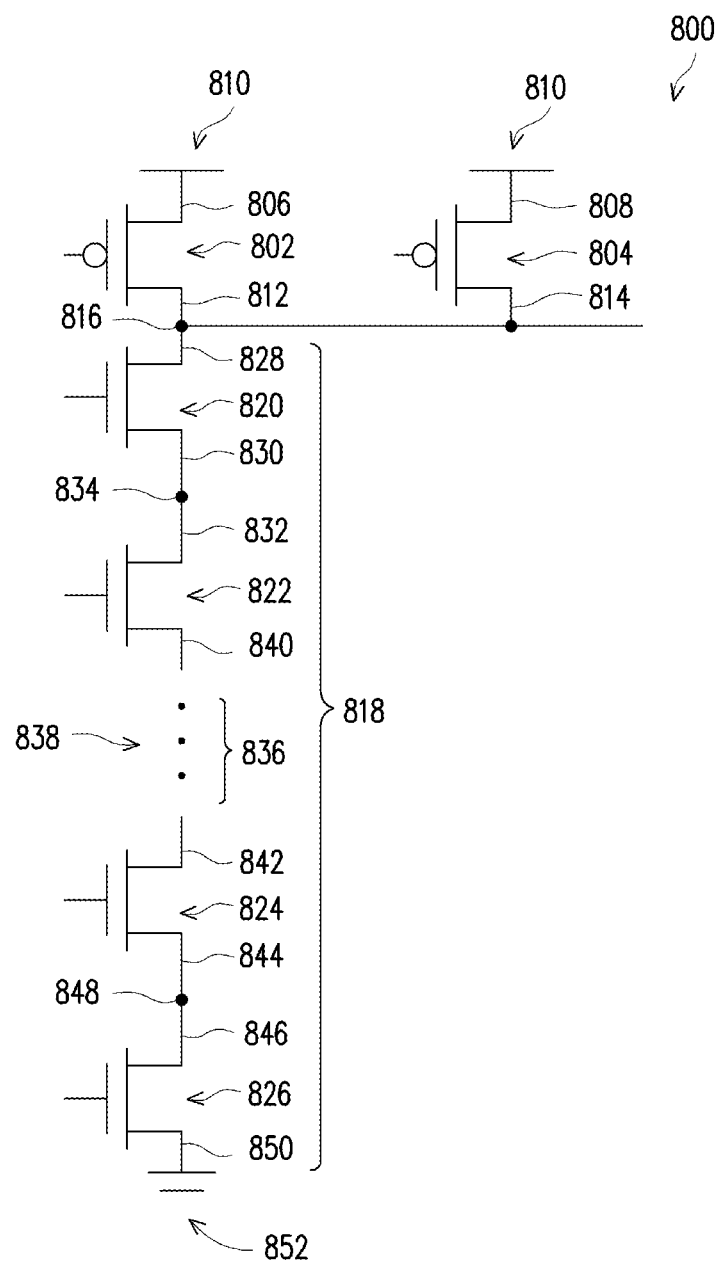
FIG. 8 illustrates an example third combination circuit that includes cascading n-type transistors in accordance with some embodiments.

FIG. 8 illustrates an example combination circuit that includes cascading n-type transistors in accordance with some embodiments. The example combination circuit 800 includes a p-type transistor 802 connected in parallel with another p-type transistor 804. The terminal (e.g., S/D region) 806 of the transistor 802 and the terminal (e.g., S/D region) 808 of the transistor 804 are connected to a voltage source 810 (e.g., VSS). The terminal (e.g., S/D region) 812 of the transistor 802 and the terminal (e.g., S/D region) 814 of the transistor 804 are connected together at node 816.

The p-type transistor 802 is connected in series with a set 818 of cascading n-type transistors 820, 822, 824, 826. The number of transistors in the set 818 can be any number equal to or greater than two. In FIG. 8, the sizing of the cascading n-type transistors 802, 822, 824, 826 is (n×m). The number of independent internal nodes in the set 818 is (m−1), where (m−1) is equal to or greater than two.

In the illustrated embodiment, a terminal (e.g., S/D region) 828 of the transistor 820 is connected to the node 816. The terminal (e.g., S/D region) 830 of the transistor 820 and the terminal (e.g., S/D region) 832 of the transistor 822 are connected together at the internal node 834. The ellipses 836 represent zero or more additional transistors in the set. As such, there are one or more additional internal nodes (collectively referred to as internal node 838). The terminal (e.g., S/D region) 840 of the transistor 822 and the terminal (e.g., S/D region) 842 of the transistor 824 are connected together at the internal node 838. The terminal (e.g., S/D region) 844 of the transistor 824 and the terminal (e.g., S/D region) 846 of the transistor 826 are connected together at the internal node 888. The terminal (e.g., S/D region) 850 of the transistor 826 is connected to a voltage source 852 (e.g., VSS or ground).

The internal nodes 834, 838, 848 are not connected to a common metal stripe in a metal layer overlying the combination circuit 800 (e.g., first metal layer 208, second metal layer 210, or third metal layer 212 in FIG. 2). As discussed earlier, the absent connections reduce or eliminate the load on the internal nodes 834, 838, 848. Additionally, although the transistors 820, 822, 824, 826 are identical, each transistor 820, 822, 824, 826 in the set 818 is independent of the other transistors 820, 822, 824, 826 in the set 818.

Figure 9:
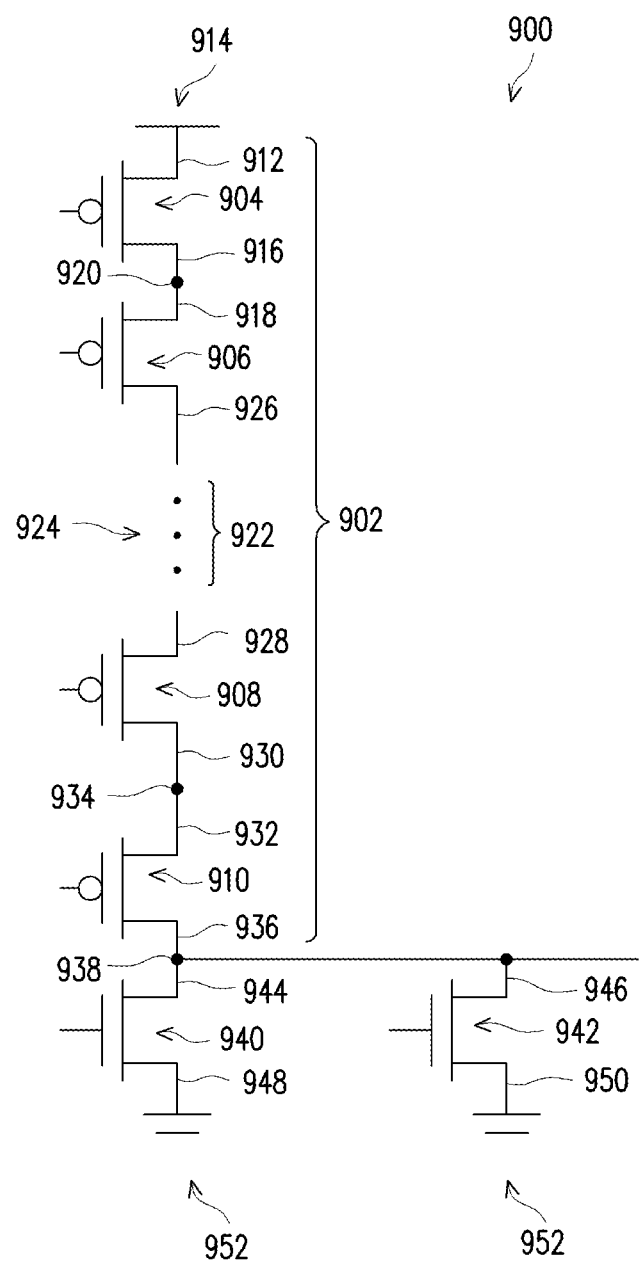
FIG. 9 depicts an example fourth combination circuit that includes cascading p-type transistors in accordance with some embodiments.

Cascading transistors can be implemented in a variety of combination circuits, such as logic circuits and amplifier circuits. The combination circuits can include cascading p-type transistors, as shown in FIG. 9. The example fourth combination circuit 900 includes a set 902 of cascading p-type transistors 904, 906, 908, 910. The number of transistors in the set 902 can be any number equal to or greater than two. Like the embodiment shown in FIG. 8, the sizing of the cascading p-type transistors 904, 906, 908, 910 is (n×m). The number of independent internal nodes in the set 902 is (m−1).

In the illustrated embodiment, a terminal (e.g., S/D region) 912 of the transistor 904 is connected to a voltage source 914 (e.g., VSS). The terminal (e.g., S/D region) 916 of the transistor 904 and the terminal (e.g., S/D region) 918 of the transistor 906 are connected together at the internal node 920. The ellipses 922 represent zero or more additional transistors in the set 902. As such, there are one or more additional internal nodes (collectively referred to as internal node 924). The terminal (e.g., S/D region) 926 of the transistor 906 and the terminal (e.g., S/D region) 928 of the transistor 908 are connected together at an internal node (e.g., internal node 924). The terminal (e.g., S/D region) 930 of the transistor 908 and the terminal (e.g., S/D region) 932 of the transistor 932 are connected together at the internal node 934. The terminal (e.g., S/D region) 936 of the transistor 910 is connected to the node 938.

The transistor 910 is connected in series with the p-type transistor 940. The p-type transistor 940 is connected in parallel with the p-type transistor 942. The terminal (e.g., S/D region) 936 of the transistor 910, the terminal (e.g., S/D region) 944 of the transistor 940, and the terminal (e.g., S/D region) 946 of the transistor 942 are connected together at the node 938. The terminal (e.g., S/D region) 948 of the transistor 940 and the terminal (e.g., S/D region) 950 of the transistor 942 are each connected to a voltage source 952 (e.g., VSS or ground).

The internal nodes 920, 924, 934 are not connected to a common metal stripe in a metal layer overlying the combination circuit 900 (e.g., first metal layer 208, second metal layer 210, or third metal layer 212 in FIG. 2). As discussed earlier, the absent connections reduce or eliminate the load on the internal nodes 920, 924, 934. Additionally, although the transistors 904, 906, 908, 910 are identical, each transistor 904, 906, 908, 910 in the set 902 is independent of the other transistors 904, 906, 908, 910 in the set 902.

Figure 10:
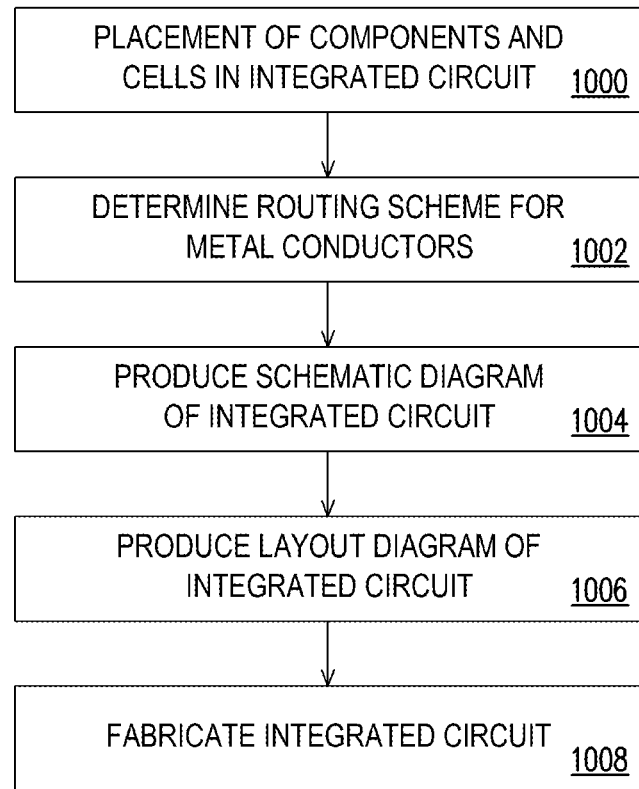
FIG. 10 illustrates a flowchart of an example method of designing an integrated circuit in accordance with some embodiments.

FIG. 10 illustrates a flowchart of an example method of designing an integrated circuit in accordance with some embodiments. Initially, as shown in block 1000, a placement operation is performed to determine the locations of the components and/or circuits in the cells as well as the locations of the cells in an IC. Next, as shown in block 1002, a routing scheme for the metal conductors in the IC is determined. In one embodiment, the routing scheme determines the number of metal layers to be fabricated to provide signals to and from the components and cells in the integrated circuit. A schematic diagram of the IC is then produced at block 1004. The schematic diagram is based on the placement of the components/circuits and cells determined at block 1000 and the routing scheme determined at block 1002. Based on the schematic diagram, a layout diagram of the IC is produced at block 1006. The integrated circuit can be fabricated at block 1008 based on the layout diagram.

Figure 11:
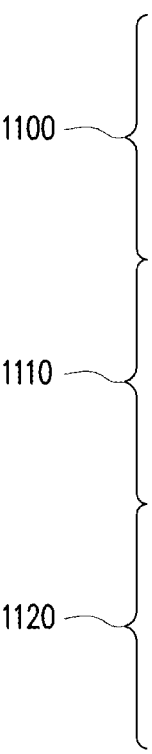
FIG. 11 depicts a set of bus naming rules for a three-input NAND circuit in accordance with some embodiments.
Figure 12:
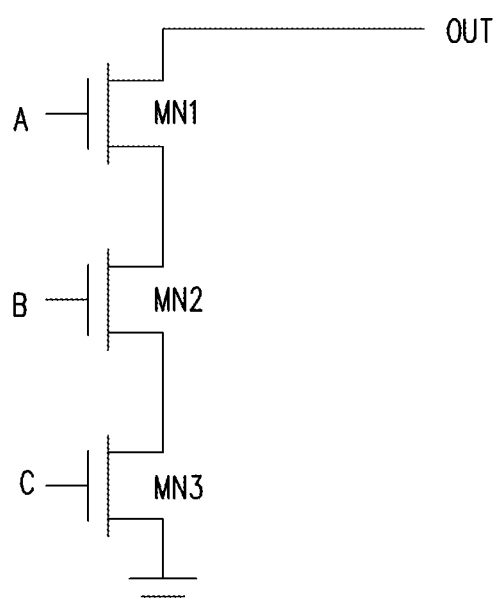
FIG. 12 illustrates a set of cascading transistors that is defined by the set of bus naming rules shown in FIG. 11 in accordance with some embodiments.

In some embodiments, the schematic diagram uses a bus type naming rule to describe a set of cascading transistors. For example, a bus type naming rule can be used when a set cascading transistors has a size defined by (2fin×m), where m is the number of the cascading transistors in the set, m is greater than one, and the number of internal nodes is greater than one. FIG. 11 depicts a set of bus naming rules for a three-input NAND circuit in accordance with some embodiments. FIG. 12 illustrates a set of cascading transistors that is defined by the set of bus naming rules shown in FIG. 11 in accordance with some embodiments.

In FIG. 12, three-input NAND circuit has inputs A, B, and C. Since m equals four (4), and there are three inputs, the set 1101 of bus naming rules shown in FIG. 11 includes twelve (12) names (four (m)×three inputs A, B, C=12) for the twelve transistors that form the three-input NAND circuit. The gates A for four transistors are connected together, the gates B for four transistors are connected together, and the gates C for four transistors are connected together.

In FIG. 11, the subset 1100 of names 1102, 1104, 1106, 1108 are associated with input A (e.g., gate A). The subset 1110 of names 1112, 1114, 1116, 1118 are associated with input B (e.g., gate B). The subset 1120 of names 1122, 1124, 1126, 1128 are associated with input C (e.g., gate C). The term "nch" in each name 1102, 1104, 1106, 1108, 1112, 1114, 1116, 1118, 1122, 1124, 1126, 1128 indicates the transistors are n-type (n-channel) transistors. The variable m=1 in each name 1102, 1104, 1106, 1108, 1112, 1114, 1116, 1118, 1122, 1124, 1126, 1128 shows each transistor is an independent single transistor. In other embodiments, additional or fewer names can be included in a subset and/or the number of subsets may differ from the subsets 1100, 1110, 1120 shown in FIG. 11. Additionally or alternatively, in some or all of the names 1102, 1104, 1106, 1108, 1112, 1114, 1116, 1118, 1122, 1124, 1126, 1128, the term "pch" for a p-type (p-channel)

transistor can be used instead of the term "nch" and/or the variable m can equal a number other than one (1).

The names 1102, 1104, 1106, 1108 define the drain and source connections for each of the four transistors associated with the input A. The four transistors having the input A are labeled MN1, the drains of the transistors MN1 are labeled OUT, OUT, OUT, OUT, and the sources of the transistors MN1 are labeled Net_1<3>, Net_1<2>, Net_1<1>, Net_1<0>. The name 1102 states the drain of the fourth transistor (MN1<3>) having the input A is connected to OUT and the source of the fourth transistor (MN1<3>) is connected to Net_1<2>. The name 1104 states the drain of the third transistor (MN1<2>) having the input A is connected to OUT and the source of the third transistor (MN1<2>) is connected to Net_1<2>. The name 1106 states the drain of the second transistor (MN1<1>) having the input A is connected to OUT and the source of second transistor (MN1<1>) is connected to Net_1<1>. The name 1108 states the drain of the first transistor (MN1<0>) having the input A is connected to OUT and the source of the first transistor (MN1<0>) is connected to Net_1<0>.

The names 1112, 1114, 1116, 1118 define the drain and source connections for each of the four transistors associated with the input B. The four transistors having the input B are labeled MN2, the drains of the transistors MN2 are labeled Net_1<3>, Net_1<2>, Net_1<1>, Net_1<0>, and the sources of the transistors MN1 are labeled Net_2<3>, Net_2<2>, Net_2<1>, Net_2<0>. The name 1112 states the drain of the fourth transistor (MN2<3>) having the input B is connected to the source of the fourth transistor (MN1<3>) having the input A. The name 1112 further states the source of the fourth transistor (MN2<3>) having the input B is connected to Net_2<3>. The name 1114 states the drain of the third transistor (MN2<2>) having the input B is connected to the source of the third transistor (MN1<2>) having the input A. The name 1114 further states the source of the third transistor (MN2<2>) having the input B is connected to Net_2<2>. The name 1116 states the drain of the second transistor (MN2<1>) having the input B is connected to the source of the second transistor (MN1<1>) having the input A. The name 1116 further states the source of the second transistor (MN2<1>) having the input B is connected to Net_2<1>. The name 1118 states the drain of the first transistor (MN2<0>) having the input B is connected to the source of the first transistor (MN1<0>) having the input A. The name 1118 further states the source of the first transistor (MN2<0>) having the input B is connected to Net_2<0>.

The names 1122, 1124, 1126, 1128 define the drain and source connections for each of the four transistors associated with the input C. The four transistors having the input C are labeled MN3, the drains of the transistors MN3 are labeled Net_2<3>, Net_2<2>, Net_2<1>, Net_2<0>, and the sources of the transistors MN3 are labeled VSS. The name 1122 states the drain of the fourth transistor (MN3<3>) having the input C is connected to the source of the fourth transistor (MN2<3>) having the input B, and the source of the fourth transistor (MN3<3>) having the input C is connected to VSS. The name 1124 states the drain of the third transistor (MN3<2>) having the input C is connected to the source of the third transistor (MN2<2>) having the input B, and the source of the third transistor (MN3<2>) having the input C is connected to VSS. The name 1126 states the drain of the second transistor (MN3<1>) having the input C is connected to the source of the second transistor (MN2<1>) having the input B, and the source of the second transistor (MN3<1>) having the input C is connected to VSS. The name 1128 states the drain of the first transistor (MN3<0>) having the input C is connected to the source of the first transistor (MN2<0>) having the input B, and the source of the fourth transistor (MN3<0>) having the input C is connected to VSS.

As described earlier, the number of names is based on the number of transistors that is used to construct a set of cascading transistors. Thus, in other embodiments, the number of names is not limited to twelve names. For example, in other embodiments the number of names can be eight for eight transistors (number of inputs=2 and m=4) or the number of names can be four for four transistors (number of inputs=2 and m=2).

In some embodiments, a design for an IC is provided by a computer system such as an Electronic Computer-Aided Design (ECAD) system. ECAD tools and methods facilitate the design, partition, and placement of circuits and/or components in an IC on a semiconductor substrate. The ECAD process typically includes turning a behavioral description of an IC into a functional description, which is then decomposed into logic functions and mapped into cells that implement the logic or other electronic functions. Such cells may be defined and stored in a cell library. Once mapped, a synthesis is performed to turn the structural design into a physical layout. In some instances, the design may be optimized post layout.

Figure 13:
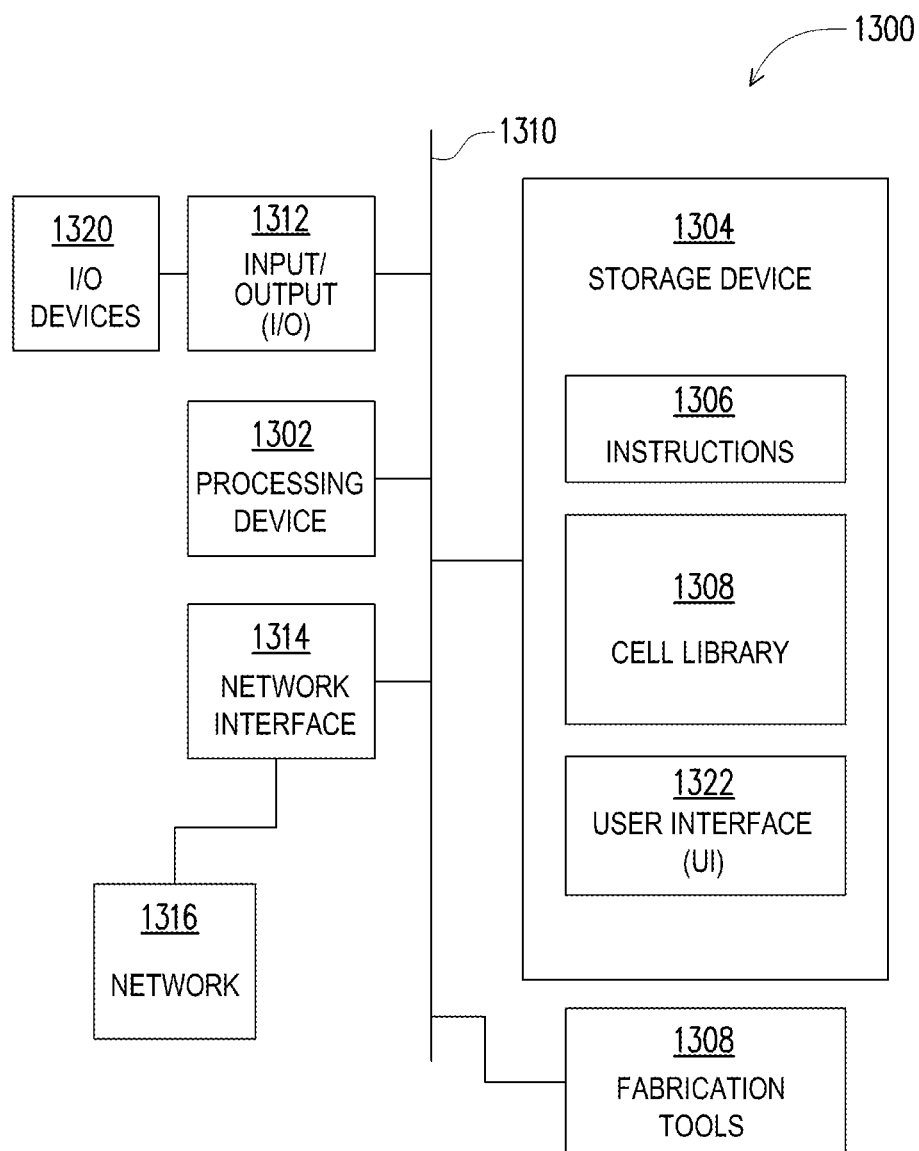
FIG. 13 depicts an example system that is suitable for designing an integrated circuit in accordance with some embodiments.

FIG. 13 depicts an example system that is suitable for designing an integrated circuit in accordance with some embodiments. The design process may be implemented by a computer system, such as an ECAD system. Some or all of the operations for design (e.g., layout) methods disclosed herein are capable of being performed as part of a design procedure performed in a design house, such as the design house 1702 discussed below in conjunction with FIG. 17.

In some embodiments, the system 1300 includes an automated place and route (APR) system. In some embodiments, the system 1300 includes a processing device 1302 and a non-transitory, computer-readable storage medium 1304 ("storage device"). The processing device 1302 is any suitable processing device or processing devices. Example processing devices include, but are not limited to, a central processing unit, a microprocessor, a distributed processing system, an application specific integrated circuit, a graphics processing unit, a field programmable gate array, or combinations thereof.

The storage device 1304 may be encoded with or store, for example, computer program code (e.g., a set of executable instructions 1306). Execution of the executable instructions 1306 by the processing device 1302 represents (at least in part) an ECAD tool that implements a portion or all of, the methods described herein to produce the designs for the structures and the ICs disclosed herein. Further, the fabrication tools 1308 may be included for layout and physical implementation of the ICs. In one or more embodiments, the storage device 1304 is an electronic, magnetic, optical, electromagnetic, infrared, and/or a semiconductor system (or apparatus or device). For example, the storage device 1304 includes a semiconductor or solid-state memory, a magnetic tape, a removable computer diskette, a random access memory (RAM), a read-only memory (ROM), a rigid magnetic disk, and/or an optical disk. In one or more embodiments using optical disks, the storage device 1304 includes a compact disk-read only memory (CD-ROM), a compact disk-read/write (CD-R/W), and/or a digital video disc (DVD).

The processing device 1302 is operably connected to the storage device 1304 via a bus 1310. The processing device 1302 is also operably connected to an input/output (I/O)

interface 1312 and a network interface 1314 by the bus 1310. The network interface 1314 is operably connected to a network 1316 so that the processing device 1302 and the storage device 1304 are capable of connecting to external elements via the network 1316. In one or more embodiments, the network 1316 is illustrative of any type of wired and/or wireless network, such as an intranet and/or a distributed computing network (e.g., the Internet).

The network interface 1314 allows the system 1300 to communicate with other computing or electronic devices (not shown) via the network 1316. The network interface 1314 includes wireless network interfaces and/or wired network interfaces. Example wireless network interfaces include BLUETOOTH, WIFI, WIMAX, GPRS, or WCDMA. Example wired network interfaces include ETHERNET, USB, or IEEE-1364. In one or more embodiments, some or all of the processes and/or methods disclosed herein are implemented in a distributed system via the network 1316.

The processing device 1302 is configured to execute the executable instructions 1306 encoded in the storage device 1304 to cause the system 1300 to be usable for performing some or all of the processes and/or methods. For example, an electronic design application (e.g., in an ECAD system or as a standalone application) can be configured to perform the methods and techniques shown in FIGS. 3-20 and 22. Given the complexity of integrated circuits, and since integrated circuits include thousands, millions, or billions of components, the human mind is unable to perform the methods and techniques depicted in FIGS. 3-20 and 22. Unlike the human mind, an electronic design application is able to perform the operations associated with FIGS. 3-20 and 22.

In one or more embodiments, the storage device 1304 stores the executable instructions 1306 configured to cause the system 1300 to be usable for performing some or all of the processes and/or methods. In one or more embodiments, the storage device 1304 also stores information that facilitates execution of a portion of or all of the processes and/or methods. In one or more embodiments, the storage device 1304 stores a cell library 1318 that includes (at least in part) standard and/or previously designed cells.

The I/O interface 1312 is operably connected to I/O devices 1320. In one or more embodiments, the I/O devices 1320 include one or more of an image capture device, a microphone, a scanner, a keyboard, a keypad, a mouse, a trackpad, a touchscreen, and/or cursor direction keys for communicating information and commands to the processing device 1302. The I/O devices 1320 may also include one or more displays, one or more speakers, a printer, headphones, a haptic or tactile feedback device, and the like.

The system 1300 is configured to receive information through the I/O interface 1312. The information received through the I/O interface 1312 includes one or more of instructions, data, design rules, cell libraries, and/or other parameters for processing by the processing device 1302. The information is transferred to the processing device 1302 via the bus 1310. The system 1300 is configured to receive information related to a user interface (UI) through the I/O interface 1312. The information is stored in the storage device 1304 as a UI 1322 or for presentation in the UI 1322.

In some embodiments, a portion or all of the processes and/or methods is implemented as a standalone software application (e.g., an EDA) for execution by a processing device (e.g., processing device 1302). In some embodiments, a portion or all of the processes and/or methods is implemented as a software application that is a part of an additional software application. In some embodiments, a portion or all of the processes and/or methods is implemented as a plug-in to a software application. In some embodiments, at least one of the processes and/or methods is implemented as a software application that is a portion of an EDA tool. In some embodiments, a portion or all of the processes and/or methods is implemented as a software application that is used by the system 1300. In some embodiments, a layout diagram which includes standard and/or previously designed cells is generated using a tool such as VIRTUOSO available from CADENCE DESIGN SYSTEMS, Inc., or another suitable layout generating tool.

In some embodiments, the processes are realized as functions of a program stored in a non-transitory computer readable recording medium (e.g., the storage device 1304). Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

As noted above, embodiments of the system 1300 may include the fabrication tools 1308 for implementing the processes and/or methods stored in the storage device 1304. For instance, a synthesis may be performed on a design in which the behavior and/or functions desired from the design are transformed to a functionally equivalent logic gate-level circuit description by matching the design to cells selected from the cell library 1318. The synthesis results in a functionally equivalent logic gate-level circuit description, such as a gate-level netlist. Based on the gate-level netlist, a photolithographic mask may be generated that is used to fabricate the IC by the fabrication tools 1308. Further aspects of device fabrication are disclosed in conjunction with FIG. 17, which is a block diagram of an integrated circuit manufacturing system, and a manufacturing flow associated therewith, in accordance with some embodiments. In some embodiments, based on a layout diagram, at least one of: (a) one or more semiconductor masks; or (b) at least one component in a layer of a semiconductor IC is fabricated using the manufacturing system 1700.

Figure 14:
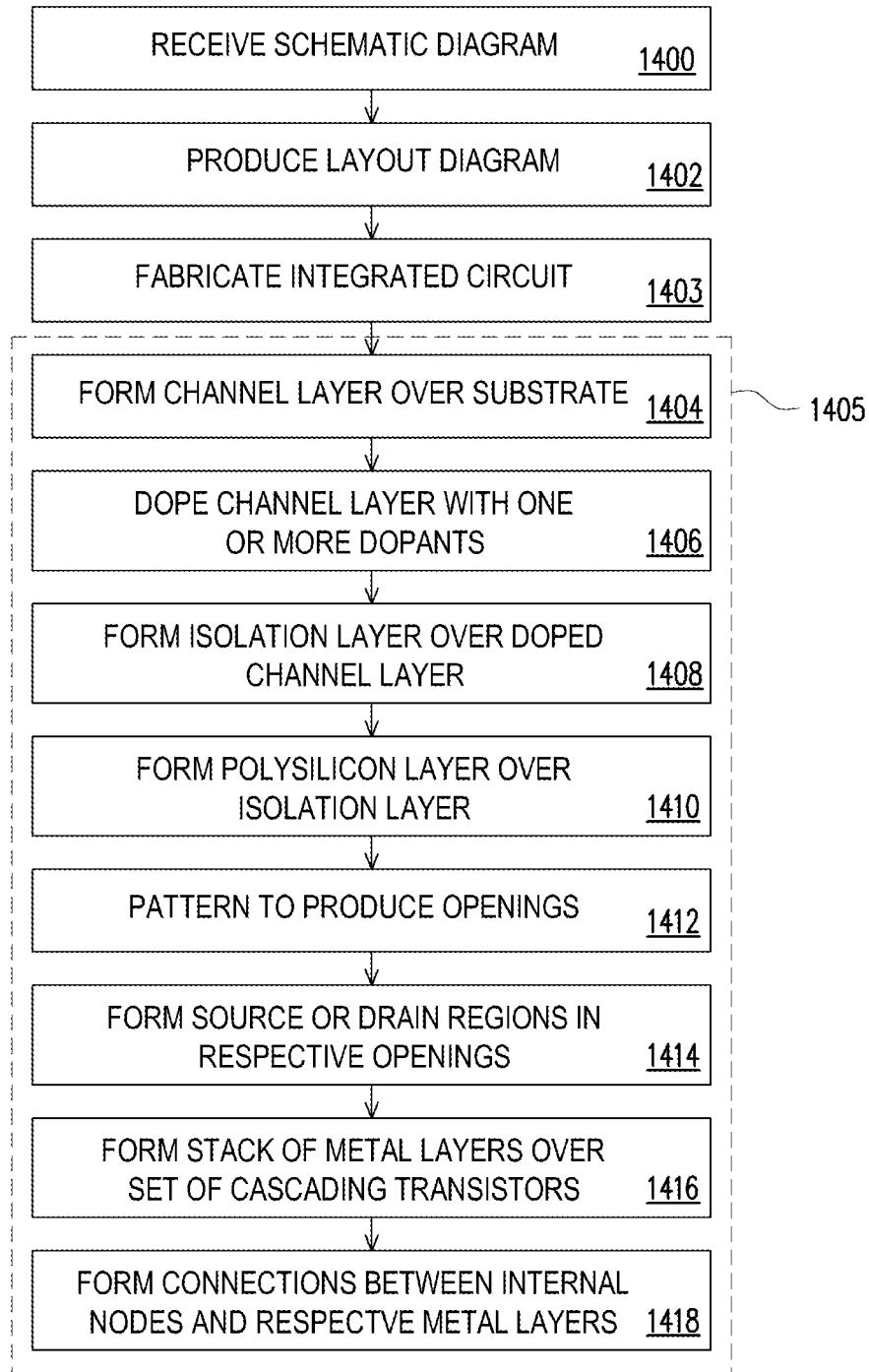
FIG. 14 illustrates a flowchart of an example method of fabricating a set of cascading transistors in accordance with some embodiments.

FIG. 14 illustrates a flowchart of an example method of fabricating a set of cascading transistors in accordance with some embodiments. Initially, a schematic diagram of an IC is received at block 1400. The schematic diagram defines a set of cascading transistors using the bus type naming rule described in conjunction with FIG. 11. Next, a layout diagram for the IC is generated at block 1402. The layout diagram includes geometrical patterns, or a layout diagram for the set of cascading transistors.

The integrated circuit is fabricated at block 1403 using the layout diagram. Fabrication of the IC includes fabricating one or more circuits that operably connect to the set of cascading transistors and fabricating the set of cascading transistors. The process of fabricating the set of cascading transistors in block 1405 begins with forming a channel layer over a substrate at block 1404. Any suitable method can be used to form the channel layer. For example, the channel layer can be deposited over the substrate. Additionally, any suitable substrate can be used. An example substrate includes, but is not limited to, a silicon substrate, a gallium arsenide substrate, a silicon-on-insulator substrate, a gallium nitride substrate, and a silicon carbide substrate.

Next, as shown in block 1406, the channel layer is doped with one or more dopants, such as one or more n-type dopants or one or more p-type dopants. An isolation layer is then formed over the doped channel layer (block 1408). Any suitable method can be used to form the isolation layer. For example, the isolation layer can be deposited over the doped channel layer.

A polysilicon ("poly") layer is formed over the isolation layer at block 1410. The poly layer is used to form the gates of the transistors in the set of cascading transistors. Any suitable method can be used to form the poly layer. For example, the poly layer can be deposited over the isolation layer.

The poly layer, the isolation layer, and the doped channel layer are then patterned to produce openings that expose a surface of the substrate (block 1412). The patterning of the poly layer produces the gates of the transistors in the set of cascading transistors. Any suitable method or methods can be used to pattern poly layer, the isolation layer, and the doped channel layer. For example, in one embodiment, a mask layer is formed over the poly layer, the isolation layer, and the doped channel layer and developed to define the locations of the openings. The poly layer, the isolation layer, and the doped channel layer are then etched to produce the openings.

In another embodiment, a first mask layer is formed over the poly layer and developed to define the locations of the openings and the poly layer is then etched to produce openings in the poly layer. A second mask layer is then formed over the poly layer and developed to define the locations of the openings and the isolation layer is etched to produce openings in the isolation layer. The locations of the openings in the isolation layer substantially align with the openings in the poly layer. A third mask layer is then formed over the poly layer and developed to define the locations of the openings and the doped channel layer is etched to produce openings in the doped channel layer. The locations of the openings in the doped channel layer substantially align with the openings in the isolation and poly layers.

Next, as shown in block 1414, a source region or a drain region is formed in respective openings. A stack of metal layers is then formed above the set of cascading transistors (block 1416). Each metal layer includes metal stripes. The internal nodes in the set of cascading transistors are operably connected to a respective metal stripe in one more of the metal layers (block 1418). The internal nodes are not connected to the same metal stripe (e.g., a common metal stripe) in any of the metal layers.

Figure 15:
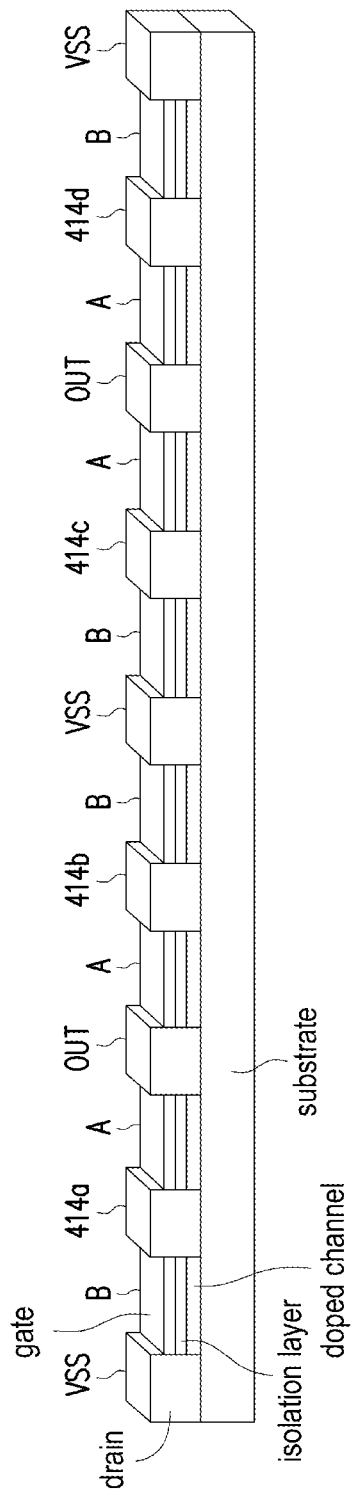
FIG. 15 depicts the set of cascading transistors shown in FIG. 4 after the method of FIG. 14 is performed in accordance with some embodiments.

FIG. 15 depicts the set of cascading transistors shown in FIG. 4 after the method of FIG. 14 is performed in accordance with some embodiments. In particular, the set of cascading transistors are shown after blocks 1400, 1402, 1404, 1406, 1408, 1410, 1412, and 1414 have been performed. As described previously, m=4 for the set 415 of cascading transistors and there are two inputs (input A, input B). Thus, eight transistors (2×4) are fabricated for the set 415.

Figure 16:
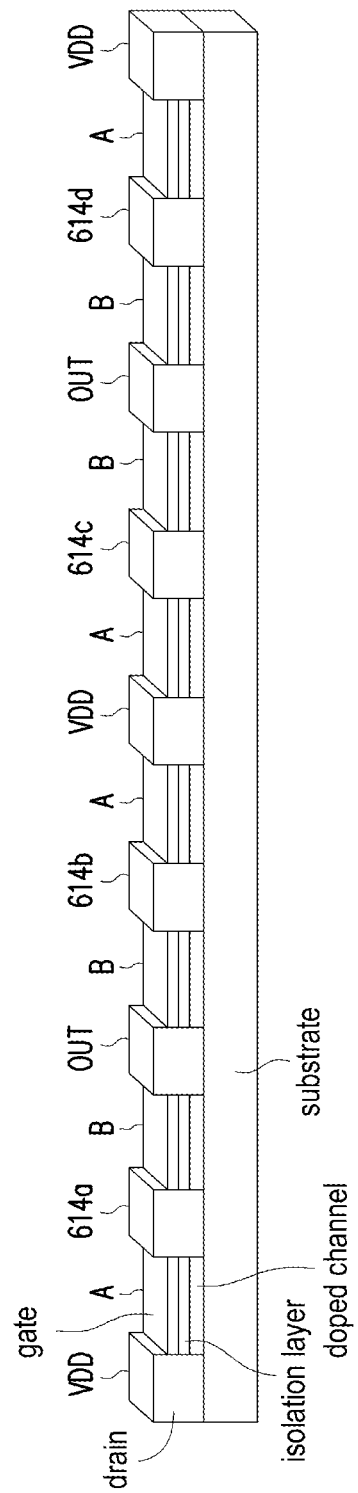
FIG. 16 illustrates the set of cascading transistors shown in FIG. 6 after the method of FIG. 14 is performed in accordance with some embodiments.

FIG. 16 illustrates the set of cascading transistors shown in FIG. 6 after the method of FIG. 14 is performed in accordance with some embodiments. In particular, the set of cascading transistors are shown after blocks 1400, 1402, 1404, 1406, 1408, 1410, 1412, and 1414 have been performed. As described earlier, m=4 for the set 615 of cascading transistors and there are two inputs (input A, input B). Thus, eight transistors (2×4) are fabricated for the set 615.

Figure 17:
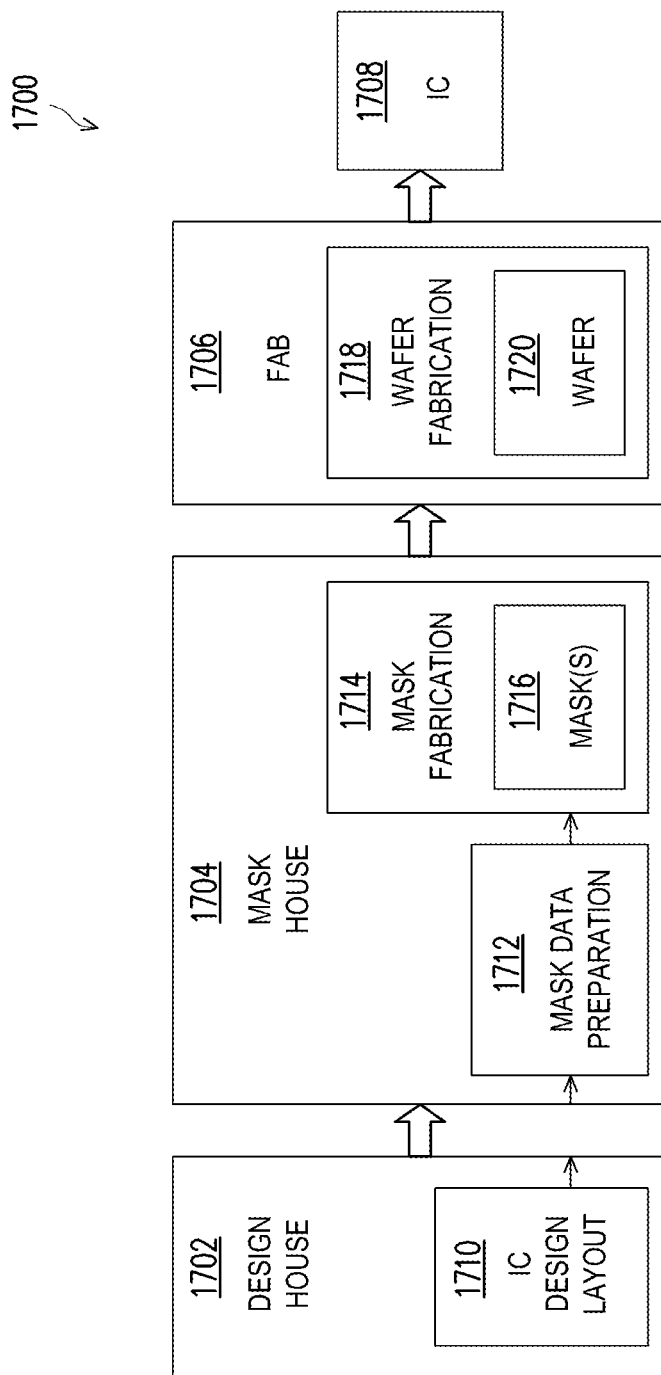
FIG. 17 depicts a block diagram of an example integrated circuit manufacturing system and manufacturing flow in accordance with some embodiments.

FIG. 17 depicts a block diagram of an example integrated circuit manufacturing system and manufacturing flow in accordance with some embodiments. In the illustrated embodiment, the IC manufacturing system 1700 includes entities, such as a design house 1702, a mask house 1704, and an IC manufacturer/fabricator ("fab") 1706, that interact with one another in the design, development, and manufacturing cycles and/or services related to manufacturing an IC 1708, such as the ICs disclosed herein. The entities in the system 1700 are operably connected by a communication network (not shown). In some embodiments, the communication network is a single network. In some embodiments, the communication network is a variety of different networks, such as an intranet and the Internet. The communication network includes wired and/or wireless communication channels.

Each entity interacts with one or more of the other entities and provides services to and/or receives services from one or more of the other entities. In some embodiments, two or more of the design house 1702, the mask house 1704, and the IC fab 1706 is owned by a single company. In some embodiments, two or more of the design house 1702, the mask house 1704, and the IC fab 1706 coexist in a common facility and use common resources.

The design house (or design team) 1702 generates an IC design layout diagram 1710. As described earlier, the IC design layout diagram 1710 is typically created based on a schematic diagram of the IC, and the schematic diagram can include a set of names that conform to the bus type naming rule described in conjunction with FIG. 11. The IC design layout diagram 1710 includes various geometrical patterns, or IC layout diagrams designed for the IC 1708 to be fabricated. The geometrical patterns correspond to patterns of metal, oxide, or semiconductor layers that make up the various components of the IC 1708 to be fabricated. The various layers combine to form various IC features. For example, a portion of the IC design layout diagram 1710 includes various IC features, such as active diffusion regions, gate electrodes, source and drain, metal lines, metal stripes, or local vias, and openings for bonding pads, to be formed in a semiconductor substrate (such as a silicon wafer) and various material layers disposed on the semiconductor substrate.

The design house 1702 implements a design procedure to form the IC design layout diagram 1710. The design procedure includes one or more of logic design, physical design or place and route. The IC design layout diagram 1710 is presented in one or more data files having information of the geometrical patterns. For example, the IC design layout diagram 1710 can be expressed in a GDS file format, a GDSII file format, or a DFII file format.

The mask house 1704 includes mask data preparation 1712 and mask fabrication 1714. The mask house 1704 uses the IC design layout diagram 1710 to manufacture one or more masks 1716 to be used for fabricating the various layers of the IC 1708 according to the IC design layout diagram 1710. The mask house 1704 performs mask data preparation 1712, where the IC design layout diagram 1710 is translated into a representative data file ("RDF"). The mask data preparation 1712 provides the RDF to the mask fabrication 1714. The mask fabrication 1714 includes a mask writer (not shown) that converts the RDF to an image on a substrate, such as a mask (reticle) 1716 on a semiconductor wafer. The IC design layout diagram 1710 is manipulated by the mask data preparation 1712 to comply with particular characteristics of the mask writer and/or requirements of the IC fab 1706. In FIG. 17, the mask data preparation 1712 and the mask fabrication 1714 are illustrated as separate elements. In some embodiments, the mask data preparation 1712 and the mask fabrication 1714 can be collectively referred to as a mask data preparation.

In some embodiments, the mask data preparation 1712 includes an optical proximity correction (OPC) that uses lithography enhancement techniques to compensate for image errors, such as those that can arise from diffraction, interference, other process effects and the like. The OPC adjusts the IC design layout diagram 1710. In some embodiments, the mask data preparation 1712 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, the mask data preparation 1712 includes a mask rule checker (MRC) (not shown) that checks the IC design layout diagram 1710 that has undergone processes in OPC with a set of mask creation rules that contain certain geometric and/or connectivity restrictions to ensure sufficient margins, to account for variability in semiconductor manufacturing processes, and the like. In some embodiments, the MRC modifies the IC design layout diagram 1710 to compensate for limitations during the mask fabrication, which may undo part of the modifications performed by OPC in order to meet mask creation rules.

In some embodiments, the mask data preparation 1712 includes lithography process checking (LPC) (not shown) that simulates processing that will be implemented by the IC fab 1706 to fabricate the IC 1708. LPC simulates this processing based on the IC design layout diagram 1710 to create a simulated manufactured device, such as the IC 1708. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, and if the simulated device is not sufficiently close in shape to satisfy design rules, OPC and/or MRC are be repeated to further refine the IC design layout diagram 1710.

It should be understood that the above description of the mask data preparation 1712 has been simplified for the purposes of clarity. In some embodiments, the mask data preparation 1712 includes additional features such as a logic operation (LOP) to modify the IC design layout diagram 1710 according to manufacturing rules. Additionally, the processes applied to the IC design layout diagram 1710 during the mask data preparation 1712 may be executed in a variety of different orders.

After the mask data preparation 1712 and during the mask fabrication 1714, a mask 1716 or a group of masks 1716 are fabricated based on the IC design layout diagram 1710. In some embodiments, the mask fabrication 1714 includes performing one or more lithographic exposures based on the IC design layout diagram 1710. In some embodiments, an electron-beam (e-beam) or a mechanism of multiple e-beams is used to form a pattern on a mask(s) 1716 (photomask or reticle) based on the IC design layout diagram 1710. The mask(s) 1716 can be formed in various technologies. For example, in some embodiments, the mask (s) 1716 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of the mask(s) 1716 includes a transparent substrate (e.g., fused quartz) and an opaque material (e.g., chromium) coated in the opaque regions of the binary mask.

In another example, the mask(s) 1716 is formed using a phase shift technology. In a phase shift mask (PSM) version of the mask(s) 1716, various features in the pattern formed on the phase shift mask are configured to have a proper phase difference to enhance the resolution and imaging quality. In various examples, the phase shift mask can be attenuated PSM or alternating PSM. The mask(s) 1716 generated by the mask fabrication 1714 is used in a variety of processes. For example, a mask(s) 1716 is used in an ion implantation process to form various doped regions in the semiconductor wafer, in an etching process to form various etching regions in the semiconductor wafer, and/or in other suitable processes.

The IC fab 1706 includes wafer fabrication 1718. The IC fab 1706 is an IC fabrication business that includes one or more manufacturing facilities for the fabrication of a variety of different IC products. In some embodiments, the IC fab 1706 is a semiconductor foundry. For example, there may be a manufacturing facility for the front end fabrication of a plurality of IC products (FEOL fabrication), while a second manufacturing facility may provide the back end fabrication for the interconnection and packaging of the IC products (BEOL fabrication), and a third manufacturing facility may provide other services for the foundry business.

The IC fab 1706 uses the mask(s) 1716 fabricated by the mask house 1704 to fabricate the IC 1708. Thus, the IC fab 1706 at least indirectly uses the IC design layout diagram 1710 to fabricate the IC 1708. In some embodiments, a semiconductor wafer 1720 is fabricated by the IC fab 1706 using the mask(s) 1716 to form the IC 1708. In some embodiments, the IC fab 1706 includes performing one or more lithographic exposures based at least indirectly on the IC design layout diagram 1710. The semiconductor wafer 1720 includes a silicon substrate or other proper substrate having material layers formed thereon. The semiconductor wafer 1720 further includes one or more of various doped regions, dielectric features, multilevel interconnects, and the like (formed at subsequent manufacturing steps).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In one aspect, a combination circuit includes a set of cascading transistors having a first internal node and a second internal node formed in an active region, and a stack of metal layers disposed over the active region and the set of cascading transistors. The active region includes at least one of a p-type well and an n-type well. Each metal layer in the stack of metal layers includes a plurality of metal stripes, and the first and the second internal nodes are not connected a common metal stripe in the stack of metal layers.

In another aspect, an integrated circuit includes a set of cascading transistors having multiple internal nodes that are formed in an active region that comprises at least one of a p-type well or an n-type well, and a metal layer disposed over the active region and the set of cascading transistors. A number of transistors in the set of cascading transistors is (m), where m is greater than two. The metal layer includes a plurality of metal stripes and the multiple internal nodes are not connected a common metal stripe in the metal layer.

In yet another aspect, a method of fabricating a set of cascading transistors in an integrated circuit includes receiving a schematic diagram for the integrated circuit and generating a layout diagram for the integrated circuit. The schematic includes a set of names for the transistor in the set of cascading transistor that conform to a bus type naming rule. The layout diagram including a layout for the set of cascading transistors. Based on the layout diagram for the integrated circuit, the integrated circuit is fabricated, including the set of cascading transistors. Fabricating the set of cascading transistors includes forming a doped channel layer over a substrate, forming an isolation layer over the doped channel layer, and forming a polysilicon layer over the isolation layer. The doped channel layer, the isolation layer, and the polysilicon layer are patterned to produce a plurality of openings, where each opening exposes a surface of the substrate and the patterning of the polysilicon layer forms gates for the transistors in the set of cascading transistors. A source region or a drain region is formed in respective openings in the plurality of openings.

The description and illustration of one or more aspects provided in this application are not intended to limit or restrict the scope of the disclosure as claimed in any way. The aspects, examples, and details provided in this application are considered sufficient to convey possession and enable others to make and use the best mode of claimed disclosure. The claimed disclosure should not be construed as being limited to any aspect, example, or detail provided in this application. Regardless of whether shown and described in combination or separately, the various features (both structural and methodological) are intended to be selectively included or omitted to produce an embodiment with a particular set of features. Having been provided with the description and illustration of the present application, one skilled in the art may envision variations, modifications, and alternate aspects falling within the spirit of the broader aspects of the general inventive concept embodied in this application that do not depart from the broader scope of the claimed disclosure.

What is claimed is:

1. A combination circuit, comprising:
a set of cascading transistors that include a first internal node and a second internal node formed in an active region, the active region including at least one of a p-type well or an n-type well; and
a stack of metal layers disposed over the active region and the set of cascading transistors, wherein each metal layer in the stack of metal layers comprises a plurality of metal stripes and the first and the second internal nodes are not connected a common metal stripe in the stack of metal layers, the common metal stripe comprising a single metal stripe in the stack of metal layers.

2. The combination circuit of claim 1, wherein the combination circuit comprises a NAND circuit.

3. The combination circuit of claim 1, wherein the combination circuit comprises a NOR circuit.

4. The combination circuit of claim 1, wherein the first internal node is connected to a first metal stripe in a first metal layer and the second internal node is connected to a different second metal stripe in the first metal layer.

5. The combination circuit of claim 1, wherein the set of cascading transistors is a set of cascading n-type transistors or a set of cascading p-type transistors.

6. An integrated circuit, comprising:
a set of cascading transistors that includes multiple internal nodes formed in an active region that comprises at least one of a p-type well or an n-type well, wherein a number of transistors in the set of cascading transistors is (m), where m is greater than two; and
a metal layer disposed over the active region and the set of cascading transistors, wherein the metal layer comprises a plurality of metal stripes and the multiple internal nodes are not connected a common metal stripe in the metal layer, the common metal stripe comprising a single metal stripe in the stack of metal layers.

7. The integrated circuit of claim 6, wherein the integrated circuit comprises a static random access memory device.

8. The integrated circuit of claim 6, wherein the set of cascading transistors is a set of cascading n-type transistors.

9. The integrated circuit of claim 8, further comprising a first p-type transistor connected in parallel with a second p-type transistor, and the first p-type transistor is connected in series with an n-type transistor in the set of cascading n-type transistors.

10. The integrated circuit of claim 6, wherein the set of cascading transistors is a set of cascading p-type transistors.

11. The integrated circuit of claim 10, further comprising a first n-type transistor connected in parallel with a second n-type transistor, and the first n-type transistor is connected in series with a p-type transistor in the set of cascading p-type transistors.

12. A method of fabricating a set of cascading transistors in an integrated circuit, the method comprising:
receiving a schematic diagram for the integrated circuit, the schematic diagram including a set of names for transistors in the set of cascading transistors that conform to a bus type naming rule;
generating a layout diagram for the integrated circuit, the layout diagram including a layout diagram for the set of cascading transistors; and
based on the layout diagram for the integrated circuit, fabricating the integrated circuit including the set of cascading transistors, wherein fabricating the set of cascading transistors comprises:
forming a doped channel layer over a substrate;
forming an isolation layer over the doped channel layer;
forming a polysilicon layer over the isolation layer;
patterning the doped channel layer, the isolation layer, and the polysilicon layer to produce a plurality of openings, wherein each opening exposes a surface of the substrate and the patterning of the polysilicon layer forms gates for the transistors in the set of cascading transistors; and
forming a source region or a drain region in respective openings in the plurality of openings.

13. The method of claim 12, further comprising:
prior to forming the doped channel layer over the substrate, forming a channel layer over the substrate; and
doping the channel layer with one or more dopants to produce the doped channel layer.

14. The method of claim 13, wherein the one or more dopants comprise one or more n-type dopants.

15. The method of claim 13, wherein the one or more dopants comprise one or more p-type dopants.

16. The method of claim 12, further comprising forming a stack of metal layers over the set of cascading transistors, each metal layer including a plurality of metal stripes.

17. The method of claim 15, further comprising forming a connection between each internal node in the set of cascading transistors and a metal stripe in one or more metal layer in the stack of metal layers, wherein each internal node is not connected to a common metal stripe in the stack of metal layers, the common metal stripe comprising a single metal stripe in the stack of metal layers.

18. The method of claim 12, wherein fabricating the integrated circuit further comprises fabricating one or more circuits that operably connect to the set of cascading transistors.

19. The method of claim 12, wherein the set of cascading transistors is a set of cascading p-type transistors.

20. The method of claim 12, wherein the set of cascading transistors is a set of cascading n-type transistors.

\* \* \* \* \*